United States Patent [19]

Grandjean et al.

[11] Patent Number: 4,961,060
[45] Date of Patent: Oct. 2, 1990

[54] ELECTROMAGNETIC DELAY LINE COMPRISING SEVERAL CASCADED SECTIONS

[75] Inventors: Daniel Grandjean, Varois; Jean-Michel Seurre; Didier Zastko, both of Dijon, all of France

[73] Assignee: Compagnie Europeenne de Composants Electroniques LCC, Courbevoie, France

[21] Appl. No.: 322,594

[22] Filed: Mar. 13, 1989

[30] Foreign Application Priority Data

Mar. 15, 1988 [FR] France .................... 88 03319

[51] Int. Cl.$^5$ .................... H03H 7/18; H03H 7/32
[52] U.S. Cl. .................... 333/140; 333/138
[58] Field of Search .................. 333/138, 140, 156, 23

[56] References Cited

U.S. PATENT DOCUMENTS

| 2,589,076 | 3/1952 | Hancock et al. | 333/140 |
| 2,702,372 | 2/1955 | Hickey | 333/140 |
| 2,874,358 | 2/1959 | Abell, Jr. | 333/138 X |
| 2,946,967 | 7/1960 | Elders | 333/139 |
| 3,908,177 | 9/1975 | Kameya | 333/138 |
| 4,639,696 | 1/1987 | Murata | 333/138 |
| 4,641,112 | 2/1987 | Kohayakawa | 333/140 |

FOREIGN PATENT DOCUMENTS 3607927 10/1986 Fed. Rep. of Germany .

OTHER PUBLICATIONS

Patent Abstracts of Japan, vol. 11, No. 119, (E-499) [2566], 14 Apr. 1987; & JP-A-61 267 405 (ELMEC CORP.) 27-11-1986.
Patent Abstracts of Japan, vol. 1, No. 42 (E-76) [2565], 25 Apr. 1977; & JP-A-51 139 234 (TOKO D.K.) 01-1-2-1976.
Elders, D. "A Novel Construction Concept for Linear Delay Lines," IRE TRANSACTIONS ON COMPONENT PARTS, vol. CP-4, No. 1, Mar. 1957 pp. 24-28.
Albrecht, P. "Entwicklung und Aufbau einer kontinuerlich regelbaren Verzogerungsleitung fur Videosignale," NACHRICHTENTECHNISCHE ZEITSCHRIFT, vol. 18, No. 11, Nov. 1965 pp. 625-633.

Primary Examiner—Eugene R. LaRoche
Assistant Examiner—Seung Ham
Attorney, Agent, or Firm—Pollock, Vande Sande & Priddy

[57] ABSTRACT

The disclosure concerns electromagnetic delay lines of the type having localized constants and being formed by a cascade of derived m networks. The chokes of the delay line are arranged in a folded line, the chokes of two consecutive networks being separated by a distance determined to obtain the desired parameter m, two non-neighboring chokes being separated by a distance sufficient to make their coupling negligible.

14 Claims, 6 Drawing Sheets

FIG_1 PRIOR ART

FIG_2 PRIOR ART

FIG_3

FIG_4

FIG_5

FIG_6

FIG_7

FIG_8

FIG_9

FIG_10

ELECTROMAGNETIC DELAY LINE COMPRISING SEVERAL CASCADED SECTIONS

BACKGROUND OF THE INVENTION

1. Field of the Invention

The invention concerns electromagnetic lumped constant delay lines.

Electromagnetic delay lines are quadripoles; the purpose of which is to delay the signals applied to their input by a constant period. They are set by the series connection of several elementary networks comprising a self-inductance constant and a capacitive constant. For electromagnetic delay lines with localized constants, these constants are those of discrete components (inductances and capacitors) connected to one another in different ways (K constant network, derived m network, etc.). The choice of the type of network used is laid down by the performance characteristics to be obtained and by the ease and cost of manufacture.

2. Description of the Prior Art

The ideal characteristics expected of a delay line comprise a constant weakening, as a function of the frequency of the injected signal, which is also a minimal weakening, a constant propagation time as a function of frequency and a constant phase shift, again as a function of frequency.

The so-called constant K network cannot be used except in a range of frequencies far below the cut-off frequency of the quadripole forming the network, namely practically down to a frequency equal to 0.15 times the cut-off frequency if it is sought to preserve a constant delay to within 1%.

On the basis of the constant K network, it is possible to define the two sorts of derived networks called derived m networks: series derived networks and parallel derived networks.

A derived m network has the advantage, as compared with a constant K network, of having a low variation in the delay as a function of the frequency, for values of m close to 1.275. For this value, the delay remains constant, to within 1%, up to a frequency equal to 0.55 times the cut-off frequency. This enables the derived m network to be used in a range of frequency which is 3.6 times wider than for the constant K network. The characteristic impedance shows, for the values of m close to 0.6, a relative variation of less than 5% in the frequency range extending from 0 to 0.85 times the cut-off frequency.

The m network thus enables two important results to be obtained: the smoothing of the delay curve (for m=1.275) and the smoothing of the characteristic impedance curve (for m=0.6). To have a delay line possessing both these characteristics, derived m networks with m=1.275 will be cascade-connected with, at the ends of the cascade, two m half networks with m=0.6.

There are several known ways of making delay lines of this type. These delay lines are differentiated by the method of coiling the chokes.

The chokes can be wound in the form of a solenoid on a cylindrical rod. However, in certain cases (the case of a low or high inductance value), this may lead to unacceptable coiling dimensions or to an excessively high resistive value of the inductance. One way of coping with this problem is to do the coiling on a magnetic support with grooves designed to take the windings. The goal sought is generally achieved, but the coiling is still difficult and expensive. It is also possible to use separate magnetic supports (rings, bars or pulleys) sufficiently spaced out between one another to prevent mutual inductance and each coiled with an intermediate connector. This embodiment has the advantage of giving the designer total liberty as regards the geometrical arrangement of the coils. However, the fabrication of the inductances is very delicate and costly. Besides, the series arrangement of the mutually coupled coils raises problems related to the amount of space occupied by the delay line thus made when their number is great. The component thus obtained is very long and unnecessarily too narrow. It becomes impossible to implant it in a printed card. It is then preferred to arrange the coils on two parallel magnetic rods in order to reduce the longitudinal space factor.

The electromagnetic delay line may then be fabricated in a DIL (dual in-line) package. The total space factor is not excessive, and the pin unit used (DIL 16 for example) is universal. However, the passage from one magnetic bar to another magnetic bar causes a break in coupling. It follows therefrom that the electromagnetic delay thus formed is actually a set of two sections of delay lines, cascaded without any special precautions. This series connection of two electromagnetic delay lines which, are efficient when used alone, include the drawbacks of a break in impedance at the link between two sections, causing stray reflections and distortions, an undulation of the delay curve and inequality in the spans of the intermediate delays.

The previously mentioned defects concerning the series connection of electromagnetic delay lines, comprising several sections, are encountered whenever it is attempted to cascade several, individually efficient, electromagnetic delay lines. While these defects can be tolerated in many instances of standard use, they are strictly unacceptable for specific applications where evenness of the amplitude/frequency, delay/frequency and impedance/frequency responses is indispensable (for example in medical echography).

In order to overcome these drawbacks, the invention proposes an electromagnetic lumped constant delay line with using networks of the derived m type and made in the form of several cascaded sections, without coupling breaks between networks. The delay line according to the invention can be prepared on a printed circuit or on any other substrate, without any coupling break between the networks within one and the same delay line, nor any coupling break with the networks of the input and output ends of the line.

SUMMARY OF THE INVENTION

An object of the invention, therefore, is an electromagnetic delay line of the type with localized constants, formed by a cascade of derived m networks, said network comprising capacitors and chokes, wherein the chokes are placed along a line which is turned back, i.e., a folded line, the chokes of two consecutive networks being separated by a distance determined to obtain the desired parameter m, two non-neighboring chokes being separated by a distance which is enough to make their coupling negligible.

BRIEF DESCRIPTION OF THE DRAWINGS

The invention will be better understood and other advantages will appear from the following description, given as a non-restrictive example, and from the appended drawings, of which:

FIG. 1 is an electrical diagram of an electromagnetic delay line according to the prior art;

FIG. 2 illustrates a standard arrangement of an electromagnetic delay line in a DIL16 package;

FIG. 3 shows a coiling support;

FIG. 4 is an explanatory diagram relating to the method of making of the coils;

FIGS. 5, 6 and 7 illustrate arrangements to be used to place the chokes of an electromagnetic delay line according to the invention;

FIGS. 8 and 9 show top and bottom views of a delay line section according to the invention;

DESCRIPTION OF PREFERRED EMBODIMENTS

FIG. 1 is a diagram of a prior art electromagnetic delay line using derived m type networks. It has a number n of $\pi$ networks.

The delay line corresponding to the n networks comprises n inductances L coupled in twos, consecutively, and n+1 capacitors. The capacitors placed between two coupled inductances have a value of 2C. Intermediate delay connectors may be made at the output of each network. Each of the inductances L is coupled to the next one depending on the degree of coupling desired: for example, k=11.9% to obtain m=1.275. To make the two half networks as input sections and output sections, with m=0.6, designed to smooth the characteristic impedance curve as a function of frequency, the indicated assembly is set up with an inductance having a value of 0.3 L and a capacitor having a value of 1.068 C placed in parallel with this inductance. The inductances of these two half networks should not be coupled to the adjacent inductances. The capacitors of the interface networks between the half networks and the adjacent $\pi$ networks should have a value of 1.6 C. As stated further above, the inductances may be coiled in the form of a solenoid on a cylindrical rod made of a non-magnetic material, for example, glass.

FIG. 2 shows a very standard arrangement of an electromagnetic delay line in a DIL16 package, using twelve networks. The package 1, made of transfer molded epoxy resin for example, has 16 external connections, such as those shown under reference 2. They are connected internally to 12 networks, arranged in parallel to the 12 rows of connections. The input of the electromagnetic delay line is accessible through the connection 3. Its main output corresponds to the connection 4. The common ground is accessible through the connections 5 and 6. Intermediate connections correspond to the connections 7. This very well known configuration can be used to make an electromagnetic delay line using derived m type networks. The chokes are wound on two rods 8 and 9, symbolically represented by broken lines. The main drawback of this delay line is formed by the linking point between the sixth and seventh networks, when the coil wire leaves one rod to get coiled on the other one. The magnetic coupling, according to the required coupling coefficient k 11.9%, is no longer ensured. It follows that the electromagnetic delay line thus formed is actually a set of two sections of delay lines, cascaded without any special precautions.

The invention enables the making of electromagnetic delay lines, the networks of which are cascade connected, for example on a printed circuit card, without any break in coupling between the networks within one and the same delay line, nor any coupling break with the end half networks of the input and output sections.

In one preferred embodiment of the invention, coil supports, preferably made of magnetic material, are used. FIG. 3 shows a pulley-shaped coil support 10. This pulley, shown with a circular section, may also have other shapes: square, rectangular, hexagonal, etc. It has a groove 11 in which the coiling will be done between the two flanges 12.

FIG. 4 shows a row of pulleys 10, in front and top views, having a pre-defined and constant distance d between their centers. The sign of the coupling coefficient k between two coils depends on the winding direction. To obtain a positive coupling, the coiling will be done in the way shown in FIG. 4, where an indication is given of the direction in which the wire should be coiled for the magnetic field force lines to have the configuration shown with broken lines. It is seen that the direction of the windings should be alternated in going from one coil to the next one. The value of the coupling coefficient k (11.9% for example) can be obtained experimentally by measuring the equivalent self-inductance value corresponding to two coupled coils. The distance d between two consecutive coils is thus determined.

Once the distance d is known, it is enough to fix the coils at the required intervals. FIG. 5 shows, from a top view, an insulating support or a substrate (printed circuit, alumina) 15 on which coiling pulleys 10 have been arranged. The pulleys are placed along a line 16 (drawn with dots and dashes), two consecutive pulleys on the line 16 being separated by the distance d. It is noted that, in this particular case, the line 16 is shaped like a reclining U. The pulleys located at the base of the U lying along the arc forming the base enable the continuity of the coupling to be ensured throughout the length of the delay line.

If FIGS. 2 (according to the prior art) and 5 (according to the invention) are compared, it may be seen that there are two sections. According to FIG. 2, one section is determined by a rod 8 or 9 and, therefore, for these devices, there are two sections with a break in coupling between these sections. According to FIG. 5, the future delay line will also have two sections, each section being an arm of the U but, in this case, there is no break in coupling.

It is advantageous to place, at the input and output sections of the delay line, two half networks with m=0.6, designed to smooth the impedance/frequency curve. To do this, the pulley can be moved away from these adjacent half networks so as to uncouple them. They can also be made to lie on the substrate so as to orient their magnetic fields by 90° with respect to the magnetic fields of the other networks, as shown in FIG. 6. In this figure, where the same references as those of FIG. 5 are repeated for the same elements, the pulleys 17 and 18, designed to receive the windings of the chokes of the input and output networks, are made to lie on the substrate 15.

FIGS. 5 and 6 refer to a delay line which should comprise 12 derived m networks and which is formed by two sections of six networks, cascaded without any variation in the degree of coupling between the input and the output. The invention can be applied to any number of networks. Similarly, there may be any number of coils providing for the junction of the base of the U, but at least one is necessary. Two rows of coils, spaced out only by a distance equal to d would have undesirable stray couplings which would be harmful to operation. The number of sections thus coupled is not limited.

FIG. 7 refers to an electromagnetic delay line according to an embodiment of the invention. In this figure, only the substrate 20 (seen from the top) and the pulleys 21, which will support the coils, have been shown. The substrate can be demarcated into six sections (separated by broken lines in the figure), each comprising six derived m networks, giving 36 networks coupled without any break in coupling. The substrate 20 may consist of only one part or may be formed by the association of six modules corresponding to the sections. Other combinations are also possible (two supports of 18 networks etc. . .). The essential point consists of the arrangement of the pulleys 21 along an imaginary line 22, shown in dots and dashes, with the pulleys following one another along this line at intervals d corresponding to the desired coupling. The line 22 has been conceived in order to meet two conditions: to place a great number of networks in a limited space and to make the couplings between non-neighboring chokes negligible. To obtain the delay line, it would be necessary then to coil the pulleys, arrange the capacitors and make the electrical connections.

Once the wiring between the different elements of the delay line (chokes, capacitors, input connections, output connections, ground connections and, possibly, intermediate output connections) has been made, the substrate 20 can be placed in a package and molded in a non-magnetic material (plastic, epoxy resin) so as to let the magnetic coupling take effect freely between the connecting networks.

By way of an example, we shall describe a method for the making and wiring of an electromagnetic delay line according to the invention. We shall consider a case where one and the same module supports two sections.

FIGS. 8 and 9 show top and bottom views of a module of this type. On one face of a substrate 30 (see FIG. 8), pulleys 31 have been fixed. These pulleys 31 are designed to support the coil. These pulleys are arranged along a line 32, shown in dots and dashes and repeating the pattern of FIG. 7. An enamelled conducting wire 33 is coiled on the pulleys 31, now in one direction and then in the other direction, as shown by the arrows drawn on the coil. Between each pulley, the wire is brought to the other face of the substrate to be soldered thereon and thus have an electrical contact Notches 34 are arranged on the periphery of the substrate 30 to make it easy for the wire 33 to be carried onto the other face. The substrate is also pierced with three holes 35 which will permit the passage of pins designed to provide for the electrical connections (input, output, ground). On the other face of the substrate 30 (see FIG. 9), the cross-hatched zones represent metallizations. The metallization 36 is a ground metallization. The metallizations 37, 38 and 39 will provide for the electronic links between the coils (the wire 33 is soldered, at intervals, to these metallizations) and the capacitors 40 and 41. In the example chosen, the capacitors 41 may have a value which is half that of the capacitors 40 according to the arrangement of the module in all the modules (end module or intermediate module). For, in certain cases, two capacitors 41 may be in parallel, and then their values are combined. Furthermore, the metallizations 38 and 39 should provide for the input and output connections of the module. In FIG. 9, the coiling wire (reference 33 in FIG. 8) has not been shown. In fact, it is carried over by the notches 34 and is soldered at intervals to the metallizations 37, 38 and 39.

The pulleys can be fixed to their substrate by bonding. A spot of bonder (UV polymerizable epoxy-epoxy resin, cyanoacrylate) can be deposited on the substrate by means of a funnel, a silk screen or, preferably, an automatic x, y, z transfer machine of the "pick and place" type. The same type of machine, or a template provided with appropriate holes, is used to place the pulleys in their position. Polymerization under infrared tunnel, oven or, preferably, by ultra-violet radiation, causes the pulleys to be firmly fixed to the substrate.

Figure 10:
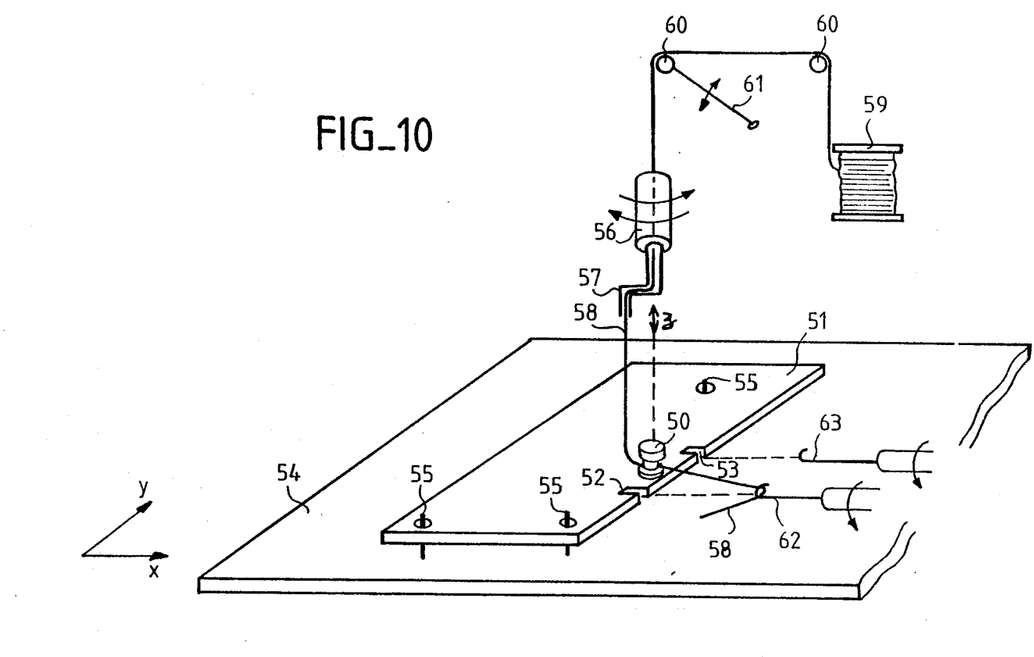
FIG. 10 illustrates a method for automatically coiling the chokes of a delay line according to the invention.

To coil the pulleys, the substrate can be placed on a table that can move along two axes x, y, according to a digital program. FIG. 10 illustrates this procedure. To simplify the drawing, only one pulley 50 has been shown on the substrate 51. For the same reason, only the two notches 52 and 53, which are on either side of the pulley 50, have been shown. The table 54 has guiding studs 55, which are inserted in the already mentioned three holes of the substrate and which will subsequently receive pins. Thus, the position of the pulleys with respect to the flier 56 is well defined. The flier 56 can be shifted in the vertical direction z and can rotate in both directions around this axis z. The flier 56 has a part 57, shaped like a hollow crank handle, into which slips the coil wire 58, coming from a coil 59. The wire 58 is guided by pulleys 60 and is accurately tautened by a standard device 61. Prior to the coiling operation, by the suitable motion of the moving table 54 along the directions x and y, and of the flier 56 in the direction z, the wire is brought behind the hook 62, and then the table brings the axis of the concerned pulley vertical to the flier 56, which is made to rotate in the desired direction to achieve the coiling of this pulley. A number of turns are made. The coil wire 58 is thus wound round the pulley 50 before it is again made to go behind the hook 63. This sequence of operations is repeated for the other pulleys.

At the end of the program for coiling the pulleys, the hooks such as 62 and 63 are made to rotate in order to twist the portions of wire that are hooked to them. The hooks are provided with cutting edges, which section and release the twists of wire at the end of the operation.

The substrate fitted with these coiled pulleys is put in a "pick and place" type of transfer machine which enables the positioning of chip type capacitors (capacitors 40 and 41 of FIG. 9) on that face of the substrate which is opposite to the one supporting the pulley. The machine provides for the soldering of the electrodes of the capacitors to the metallization of the substrate. The notches arranged at the periphery of the substrate enable the twists of wire to be turned back towards the metallized face of the substrate. These twists, after hot tinning for example, are soldered to the locations reserved for them.

The process of preparing a delay line by the association of identical sections has the advantage of making it possible to eliminate the defective sections before association. It is less costly to reject a section of 12 defective networks than to eliminate, for the same reason, a finished assembly comprising 120 networks. This possibility of intermediate checking is a major advantage of the invention as compared with the prior art. The assembly and relative mutual positioning of the sections, made in this way and checked on a main support, may be done by nail type connectors or connection pins in the insertion holes (referenced 35 in FIGS. 8 and 9). Through soldering spots, these nails or pins fulfill a dual mechanical and electrical function. They provide access to the input and output of the delay line as well as intermediate delay connections.

Before molding by epoxy resin casting for example, another electrical check can be made. Once the casting is done, the resin can be polymerized in a stove.

The use of chokes, other than those obtained by coiling a wire on a support, comes within the scope of this invention. Self-inductance coils obtained by metallizations deposited on a substrate and made by etching, for example, would also be suitable, provided that the planned distance between two successive chokes and the minimum distance between non-neighboring chokes is maintained.

If it is desired to place two half networks with $m=0.6$ at the beginning and end of the delay line, to smooth the curve of the characteristic impedance, the delay line can be designed according to the diagram of FIG. 1. The half networks may be placed in the first section and the last section by using the arrangement described with reference to FIG. 6.

What is claimed is:

1. An electromagnetic lumped constant delay line formed by cascaded m-derived networks, said networks comprising capacitors and chokes, the chokes being placed along a line that is folded back so that substantial portions of said networks are parallel, said networks being connected together by two adjacent chokes separated by a distance which provides a desired coupling parameter m, between said adjacent chokes while non-adjacent chokes are separated by a distance which renders their coupling negligible.

2. A delay line according to claim 1, wherein the chokes are formed by a wire coiled on supports.

3. A delay line according to claim 2, wherein the supports are magnetic.

4. A delay line according to claim 2, wherein the supports have a pulley shape.

5. A delay line according to claim 1, wherein the chokes are connected with metallizations deposited on a substrate.

6. A delay line according to claim 1, wherein the parameter m is equal to 1.275.

7. A delay line according to claim 1, further comprising at least one impedance matching network connected to one end of said cascaded network, designed to smooth the characteristic impedance curve, the coupling between the choke of said impedance matching network and the choke of the neighboring cascaded network comprising the delay line being such that $m=0.6$.

8. A delay line according to claim 7, wherein the chokes being obtained by the coiling of a wire on a support, the coiling of the choke of the impedance matching network is oriented by 90° with respect to the coiling of the choke of the neighboring cascaded network.

9. A delay line according to claim, 7, wherein the coupling between the choke of the impedance matching network and the choke of the neighboring cascaded network is determined by the distance between them.

10. A delay line according to claim 1, made on a substrate supporting the chokes on one of its faces and the capacitors on the other face.

11. A lumped constant delay line comprising:
at least two m derived networks connected in cascade, each network comprising a plurality of capacitors and coils, said networks disposed along parallel lines of a substrate, each coil of a network being spaced apart a distance d from an adjacent coil of said network to provide a desired magnetic coupling with an adjacent coil, said networks being coupled together at one end of said parallel lines by a coil of each network which lies along an arcuate line joining said parallel lines, spaced apart to provide coupling between said networks;
an input impedance matching network coupled to one of said networks at the remaining end of said parallel lines; and,
an output impedance matching network coupled to the remaining of said networks at the remaining end of said parallel lines.

12. The lumped constant delay line of claim 11 wherein said input and output matching networks are located with respect to said m derived networks to avoid magnetic coupling therewith.

13. The lumped constant delay line of claim 11 wherein said coils are wound on a support having an axis intersecting a respective line.

14. The lumped constant delay line of claim 11 wherein said parallel lines are spaced apart to avoid coupling between remaining coils of different networks.

* * * * *